United States Patent
Toyomaki

(10) Patent No.: US 9,760,023 B2
(45) Date of Patent: Sep. 12, 2017

(54) SUBSTRATE CARRYING DEVICE

(71) Applicant: Tokyo Electron Limited, Tokyo (JP)

(72) Inventor: Toshiaki Toyomaki, Miyagi (JP)

(73) Assignee: Tokyo Electron Limited, Tokyo (JP)

( * ) Notice: Subject to any disclaimer, the term of this patent is extended or adjusted under 35 U.S.C. 154(b) by 146 days.

(21) Appl. No.: 14/538,918

(22) Filed: Nov. 12, 2014

(65) Prior Publication Data

US 2015/0146187 A1    May 28, 2015

(30) Foreign Application Priority Data

Nov. 26, 2013 (JP) ................... 2013-243898

(51) Int. Cl.
G03B 27/58 (2006.01)
G03F 7/20 (2006.01)

(52) U.S. Cl.
CPC ................ *G03F 7/70733* (2013.01)

(58) Field of Classification Search
CPC ............. G03F 7/70733; H05K 7/1432; H05K 7/20918
See application file for complete search history.

(56) References Cited

U.S. PATENT DOCUMENTS

| | | | |
|---|---|---|---|
| 6,634,686 B2* | 10/2003 | Hosokawa | H01L 21/68707 294/213 |
| 6,942,265 B1* | 9/2005 | Boyd | H01L 21/67742 294/189 |
| 6,962,477 B2* | 11/2005 | Tateyama | H01L 21/67742 414/752.1 |
| 7,044,521 B2* | 5/2006 | Tokunaga | H01L 21/6838 294/183 |
| 7,384,083 B2* | 6/2008 | Kent | H01L 21/67126 294/213 |
| 7,669,903 B2* | 3/2010 | Bonora | H01L 21/6838 294/188 |
| 8,454,068 B2* | 6/2013 | Hashimoto | B25J 15/00 294/103.1 |
| 8,672,602 B2* | 3/2014 | Asari | H01L 21/68707 294/213 |
| 8,864,202 B1* | 10/2014 | Schrameyer | B25J 15/0014 294/213 |
| 8,991,887 B2* | 3/2015 | Shin | H01L 21/67742 294/183 |
| 2002/0041102 A1* | 4/2002 | Krauskopf | H01L 21/68707 294/213 |

(Continued)

FOREIGN PATENT DOCUMENTS

| JP | H08-017896 | 1/1996 |
|---|---|---|
| JP | 2004-209612 | 7/2004 |

(Continued)

*Primary Examiner* — Deoram Persaud
(74) *Attorney, Agent, or Firm* — IPUSA, PLLC

(57) ABSTRACT

A substrate carrying device includes pads that hold a substrate, and a hand having recesses formed therein. The pads are placed in the recesses and detachably attached to the hand. Each of the pads includes a flange, and the flange of at least one of the pads includes an outer peripheral part detachably attached to the hand, an elastic part that is able to bend in the recess, and a substrate holding part that rises from an inner edge of the elastic part and holds the substrate by vacuum suction.

7 Claims, 4 Drawing Sheets

(56) References Cited

U.S. PATENT DOCUMENTS

| | | | | |
|---|---|---|---|---|
| 2005/0006916 A1* | 1/2005 | Mantz | ............... | H01L 21/68707 294/103.1 |
| 2010/0034625 A1* | 2/2010 | Kim | ......................... | B23Q 7/04 414/226.01 |
| 2013/0180448 A1* | 7/2013 | Sakaue | ............. | H01L 21/67739 118/696 |
| 2015/0086316 A1* | 3/2015 | Greenberg | .......... | H01L 21/6838 414/752.1 |

FOREIGN PATENT DOCUMENTS

| | | |
|---|---|---|
| JP | 2010-034427 | 2/2010 |
| JP | 2011-029388 | 2/2011 |

\* cited by examiner

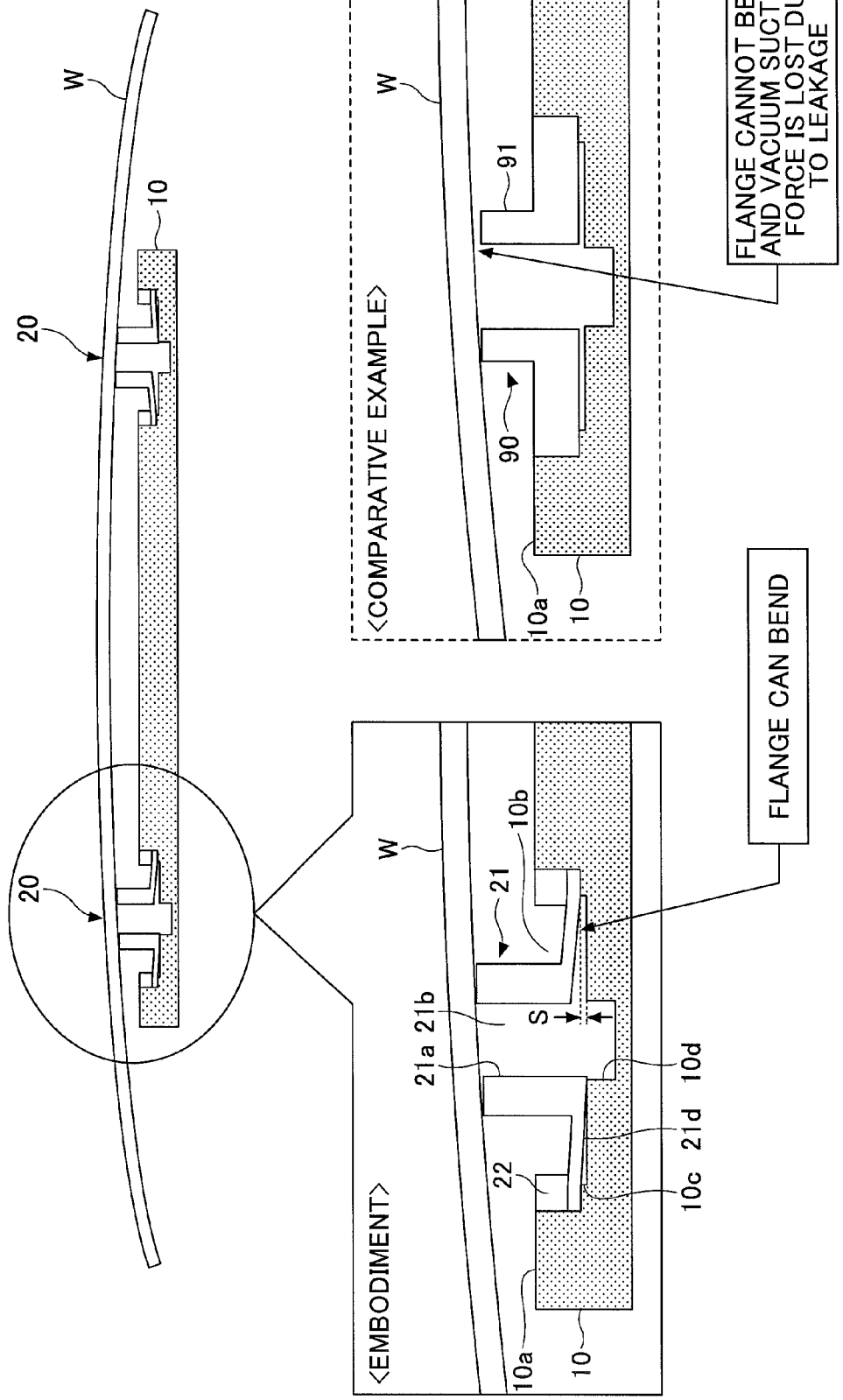

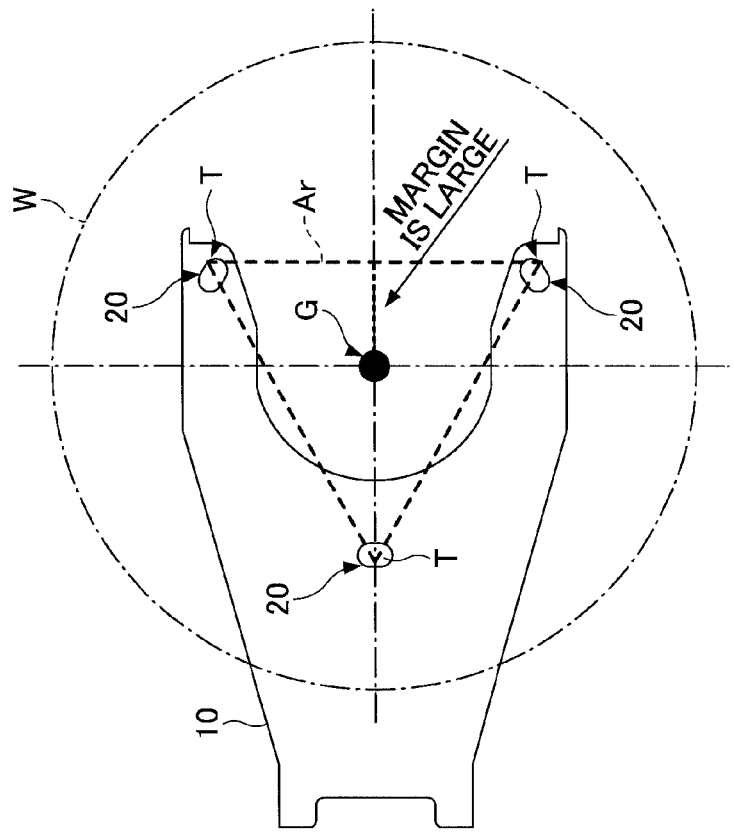
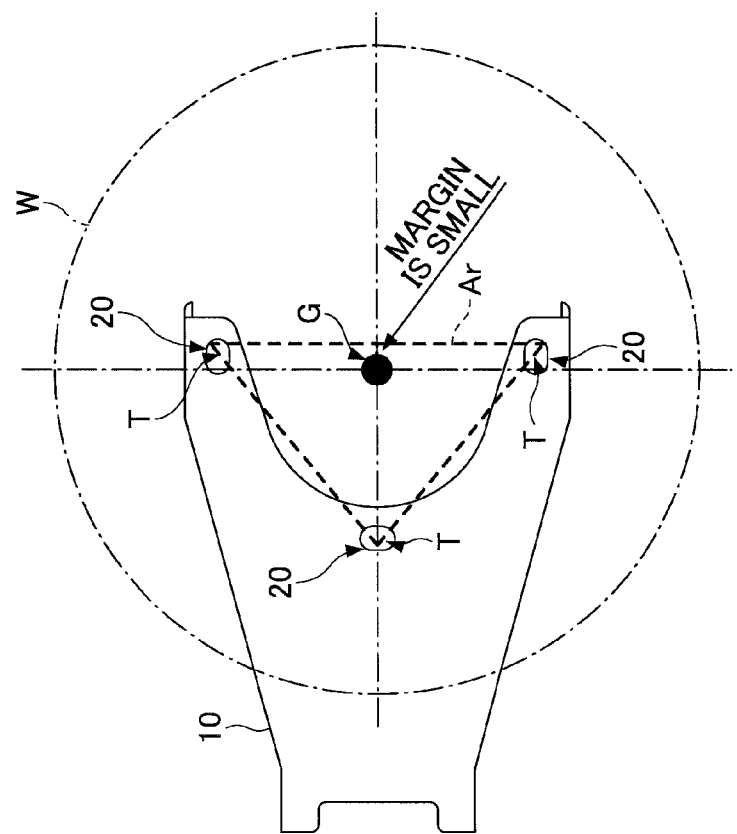

SUBSTRATE CARRYING DEVICE

CROSS-REFERENCE TO RELATED APPLICATION

The present application is based upon and claims the benefit of priority of Japanese Patent Application No. 2013-243898, filed on Nov. 26, 2013, the entire contents of which are incorporated herein by reference.

BACKGROUND OF THE INVENTION

1. Field of the Invention

An aspect of this disclosure relates to a substrate carrying device.

2. Description of the Related Art

Substrates such as wafers and reticles (photomasks) used in a process of producing semiconductor devices are generally stored in a container. When a substrate is processed in a semiconductor device production process, the substrate is taken out of the container and carried into a semiconductor production apparatus by a "hand" attached to a carrying arm. Then, a desired process such as etching, film deposition, exposure, washing, or inspection is performed by the semiconductor production apparatus on the substrate. After being processed, the substrate is carried out of the semiconductor production apparatus, and carried to another position for the next process.

When the substrate is carried, to prevent the substrate from falling off the hand, the substrate is vacuum-suctioned by an evacuation mechanism connected to a vacuum suction pad provided on the hand (see, for example, Japanese Laid-Open Patent Publication No.08-017896).

Here, a substrate sometimes warps. Particularly, when a substrate is heated to a high temperature during a process, the substrate tends to warp when it is carried. Also, as the size of a substrate increases and its thickness decreases, the amount of warpage of the substrate being carried tends to increase. When a substrate warps, a gap is formed between the vacuum suction pad and the substrate, and it becomes difficult to vacuum-suction the substrate due to leakage caused by the gap. When vacuum-suctioning the substrate becomes difficult, the risk that the substrate falls off the hand increases and it becomes difficult to carry the substrate.

Meanwhile, when a vacuum suction pad is damaged, it is preferable that the damaged vacuum suction pad is replaceable without replacing the hand to reduce the lead time and costs necessary for the replacement.

SUMMARY OF THE INVENTION

In an aspect of this disclosure, there is provided a substrate carrying device including pads that hold a substrate, and a hand having recesses formed therein. The pads are placed in the recesses and detachably attached to the hand. Each of the pads includes a flange, and the flange of at least one of the pads includes an outer peripheral part detachably attached to the hand, an elastic part that is able to bend in the recess, and a substrate holding part that rises from an inner edge of the elastic part and holds the substrate by vacuum suction.

BRIEF DESCRIPTION OF THE DRAWINGS

FIG. 3 is a drawing used to describe a mechanism to accommodate warpage of a wafer with a pad; and FIGS. 4A and 4B are drawings illustrating exemplary arrangements of pads.

DESCRIPTION OF THE PREFERRED EMBODIMENTS

Embodiments of the present invention are described below with reference to the accompanying drawings. Throughout the specification and the drawings, the same reference numbers are assigned to substantially the same components, and repeated descriptions of those components are omitted.

When a substrate is carried by a carrying arm, the substrate is vacuum-suctioned (i.e., held by vacuum) by an evacuation mechanism to prevent the substrate from falling off a "hand" attached to the carrying arm. For example, a vacuum suction pad made of resin and including an elastic pillar for supporting a semiconductor wafer (which is hereafter simply referred to as a "wafer") may be used to be able to carry even a warped wafer. Because such a vacuum suction pad is fixed to a hand with an adhesive, it is difficult to replace only the vacuum suction pad. Accordingly, when the vacuum suction pad is damaged, it is necessary to replace the hand itself. This in turn increases the lead time and costs necessary for the replacement.

An aspect of this disclosure provides a substrate carrying device including a replaceable pad that can vacuum-suction even a warped wafer by absorbing (or accommodating) the warpage of the wafer.

<Configuration of Substrate Carrying Device>

Figure 1:
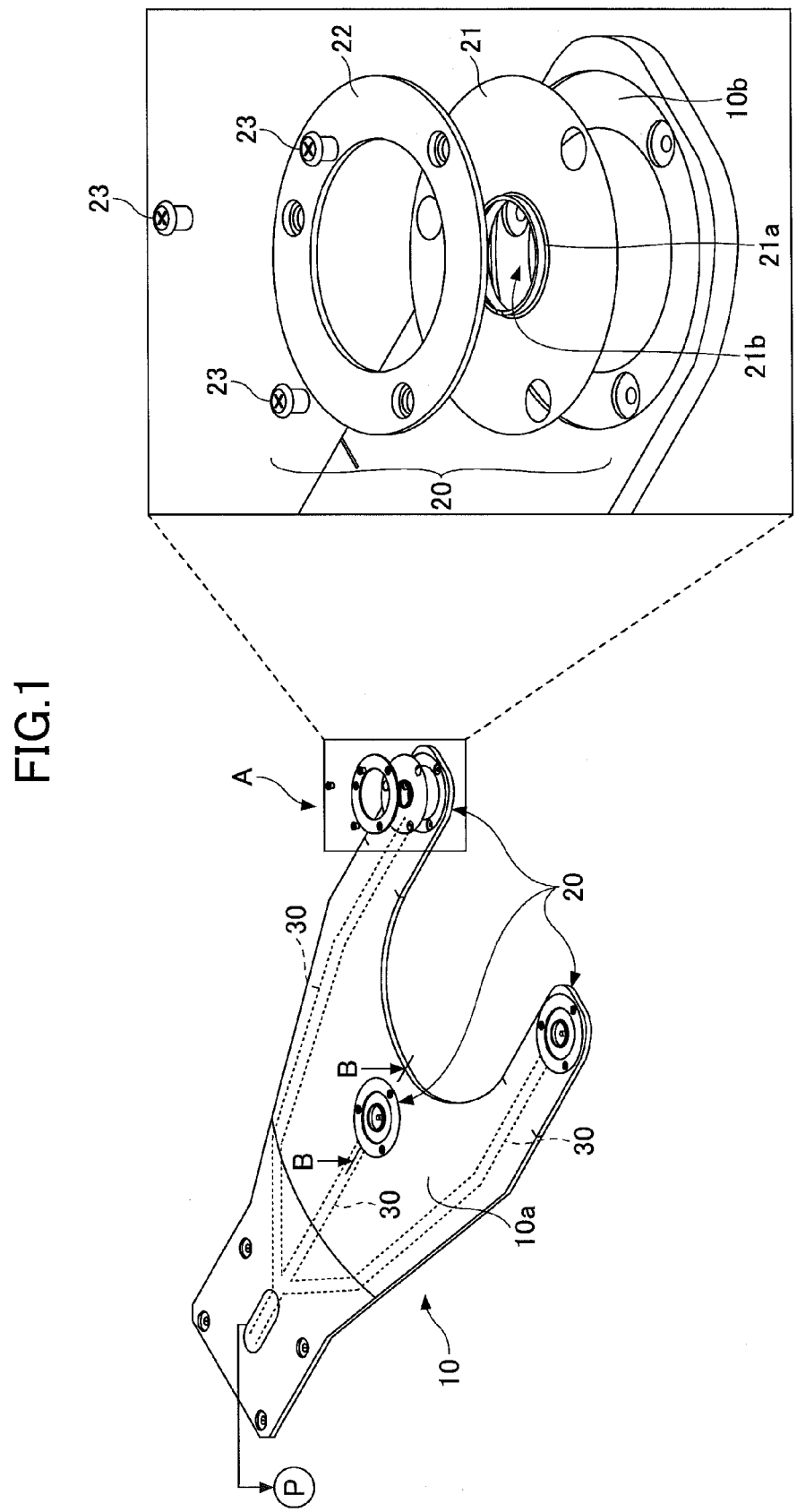
FIG. 1 is a drawing illustrating an exemplary configuration of a part of a substrate carrying device.

An exemplary configuration of a part of a substrate carrying device according to an embodiment is described below with reference to FIG. 1. FIG. 1 is a drawing illustrating an exemplary configuration of a hand 10 of the substrate carrying device.

The hand 10 includes a holding surface 10a on which a wafer is placed. The hand 10 is attached to a carrying arm (not shown), and composed of, for example, ceramics. The hand 10 includes a U-shaped part including a base and two prongs extending from the base. Pads 20 are provided at the base and the tips of the prongs (in the example of FIG. 1, three pads 20 are provided). The wafer is held on the pads 20 by vacuum suction.

An exploded view of each pad 20 (indicated by "A" in FIG. 1) is provided on the right side of FIG. 1. The pad 20 includes a flange 21, a fixing part 22 disposed on the flange 21, and screws 23 for screwing the fixing part 22 to the hand 10 and thereby fixing the flange 21 to the hand 10.

The flange 21 is made of an elastic resin pad that makes it possible to hold a warped wafer by absorbing (or accommodating) the warpage of the wafer. The resin pad is preferably made of a material having elasticity and high-temperature resistance to be able to hold a wafer at a high temperature. Examples of such materials include polyimide and polyetheretherketone (PEEK). The resin pad may be made of either a non-conductive material such as polyimide or a conductive material. When it is assumed that electric charges accumulate in the resin pad, the resin pad is preferably made of a conductive material to prevent an element formed on a wafer from being damaged by the electric charges when the wafer contacts the resin pad.

The flange 21 has a circular shape. The flange 21 preferably has a true circle shape so that when the flange 21 bends while carrying a wafer, a uniform stress is applied to the bent part of the flange 21. Still however, the flange 21 may have an oval shape or a rectangular shape.

The flange 21 includes a substrate holding part 21a for holding a wafer. The substrate holding part 21a rises from the inner edge of the flange 21, i.e., from the periphery of a through hole 21b formed in the center of the flange 21. The through hole 21b constitutes a part of an evacuation path used to vacuum-suction a wafer.

The flange 21 is placed in a recess 10b formed in the hand 10, and is pressed downward by the fixing part 22 that is fixed to the hand 10 with the screws 23. In other words, the flange 21 is fixed by the fixing part 22 and the screws 23 to the hand 10. With this configuration, the pad 20 is detachably attached to the hand 10. The fixing part 22 may be composed of, for example, ceramics.

In the present embodiment, the flange 21 and the fixing part 22 are provided as separate parts. This configuration makes it possible to replace only the flange 21, and thereby makes it possible to reduce the lead time and costs necessary to repair or replace the pad 20.

Alternatively, the flange 21 and the fixing part 22 may be formed as a single (monolithic or integrated) part. In this case, an outer peripheral part of the flange 21 may be thicker than an inner part (a part inside of the outer peripheral part, or an elastic part 21d described later) of the flange 21, and the outer peripheral part of the flange 21 may be fixed to the hand 10 with the screws 23. The inner part of the flange 21 is preferably made thin so that the flange 21 can bend.

Referring back to the left side of FIG. 1, three pads 20 are provided on the hand 10 to vacuum-suction a wafer. Each of the pads 20 communicates via the through hole 21b with an evacuation channel 30 for vacuum-suctioning a wafer. The evacuation channel 30 is formed, for example, in the hand 10, and is connected to a dry pump P that is an example of an evacuation mechanism. The dry pump P evacuates the evacuation channel 30 to vacuum-suction a wafer on the pads 20.

Here, it is not essential to configure all of the pads 20 to be able to vacuum-suction a wafer. For example, only one or two of the pads 20 may be configured to be able to vacuum-suction a wafer. Even in this case, the remaining pad or pads 20 not capable of vacuum-suctioning a wafer still need to be provided on the hand 10 to support the wafer at three points.

On the other hand, providing four or more pads 20 on the hand 10 is not preferable, because one or more of the pads 20 may become unable to contact the wafer and cause leakage during vacuum-suctioning. This is particularly true when the size of a wafer is small. For the above reasons, three pads 20 are preferably provided on the hand 10. Arrangements of the pads 20 are described later.

<Detailed Configuration of Substrate Carrying Device>

Figure 2:
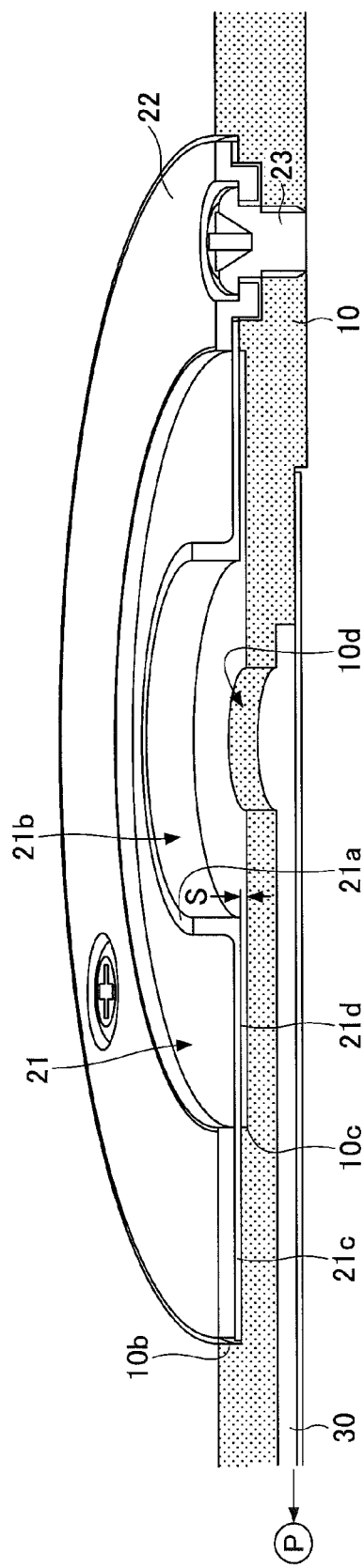
FIG. 2 is a cross-sectional view of a part of the substrate carrying device taken along line B-B of FIG. 1.

A detailed configuration of a part of the substrate carrying device according to the present embodiment is described below with reference to FIG. 2. FIG. 2 is a cross-sectional view of a part of the substrate carrying device taken along line B-B of FIG. 1.

The flange 21 is placed in the recess 10b formed in the hand 10. The fixing part 22 presses an outer peripheral part 21c of the flange 21 downward, and is fixed to the hand 10 with the screws 23. An elastic part 21d, which is inside of the outer peripheral part 21c, of the flange 21 is not covered by the fixing part 22 and is made thin so that the flange 21 can bend. Thus, the flange 21 includes the outer peripheral part 21c that is fixed to the hand 10, and the elastic part 21d that can bend. The flange 21 also includes the substrate holding part 21a for holding a wafer. The substrate holding part 21a rises from the inner edge of the elastic part 21d, i.e., from the periphery of the through hole 21b formed in the elastic part 21d. In a radial cross section of the flange 21, the elastic part 21d extending in the radial direction of the flange 21 forms an L-shape together with the substrate holding part 21a extending vertically from the elastic part 21d. The thickness of the elastic part 21d is less than the thickness of the substrate holding part 21a.

An indented part 10c is formed in the bottom of the recess 10b such that the depth of an inner part (i.e., the indented part 10c) of the recess 10b becomes greater than the depth of an outer part of the recess 10b. A space S is formed between the elastic part 21d and the bottom of the indented part 10c. The space S allows the elastic part 21d to bend according to the weight of a wafer.

The depth of the indented part 10c (from the bottom surface of the outer part of the recess 10b) may be, for example, about 0.2 mm. The thickness of the elastic part 21d may be, for example, less than or equal to 1 mm. The thickness of the elastic part 21d is less than the thickness of the substrate holding part 21a.

For example, when the thickness of the substrate holding part 21a is 0.5 mm, the thickness of the elastic part 21d may be about 0.2 mm.

The evacuation channel 30 is formed in the hand 10. Also, an opening 10d is formed in the hand 10. The opening 10d links the through hole 21b formed in the flange 21 with the evacuation channel 30. When an evacuation path formed by the evacuation channel 30, the opening 10d, and the through hole 21b is evacuated by the dry pump P, a wafer is vacuum-suctioned to the pad 20. Because the outer peripheral part 21c of the flange 21 is thin and elastic and is pressed uniformly by the fixing part 22 against the hand 10, the outer peripheral part 21c can hermetically seal the evacuation path (the evacuation channel 30, the opening 10d, and the through hole 21b) used to vacuum-suction a wafer.

An exemplary configuration of the substrate carrying device of the present embodiment is described above. Next, a mechanism to absorb (or accommodate) warpage of a wafer with the pad 20 while the wafer is carried by the hand 10 is described with reference to FIG. 3.

<Mechanism to Absorb Warpage Of Wafer>

FIG. 3 is a drawing used to describe a mechanism to absorb (or accommodate) warpage of a wafer W with the pad 20 of the present embodiment.

After being processed, the temperature of the wafer W may become high and the wafer W may warp while being carried. The right side of FIG. 3 illustrates a comparative example where a flange 91 of a pad 90 is not configured to bend. In the comparative example, when the wafer W warps, a gap is formed between the flange 91 of the pad 90 and the wafer W, and it becomes difficult to vacuum-suction the wafer W due to leakage caused by the gap. This in turn increases the risk that the wafer W falls off the hand 10, and makes it difficult to stably carry the wafer W.

According to the present embodiment, as illustrated by the left side of FIG. 3, the pad 20 includes the flange 21 including the elastic part 21d that can bend in the vertical direction, and the space S is formed by the indented part 10c of the recess 10b. With this configuration, the flange 21 bends downward using the space S (or into the space S) due to the weight of the wafer W, and can also bend upward due to the force of vacuum suction. Accordingly, the flange 21 of the pad 20 of the present embodiment can absorb (or accommodate) the warpage of the wafer W.

As described above, the flange 21 of the pad of the present embodiment includes a thin elastic part 21d that allows the flange 21 to bend. This configuration makes it possible to prevent a gap from being formed between a holding surface of the pad 20 and the wafer W, and thereby makes it possible to absorb (or accommodate) warpage of the wafer W and stably vacuum-suction the wafer W being carried.

<Arrangement of Pads>

Exemplary arrangements of the pads 20 of the present embodiment are described below with reference to FIG. 4. FIGS. 4A and 4B are drawings illustrating exemplary arrangements of the pads 20 on the hand 10. In FIG. 4A, three pads 20 are attached to the hand 10 such that the center of gravity G of the wafer W is placed in, an area Ar that is defined by lines connecting supporting points T indicating the positions of the pads 20 on the hand 10. When the center of gravity G of the wafer W is out of the area Ar, the risk that the wafer W falls off the hand 10 while being carried increases. The arrangement or the layout of the pads 20 as illustrated by FIG. 4A makes it possible to prevent the wafer W from falling off the hand 10 while being carried.

In FIG. 4B, three pads 20 are attached to the hand 10 such that the center of gravity G of the wafer W is placed at or near a position that is at the same distance from the positions of the three pads 20 and in an area Ar defined by lines connecting supporting points T indicating the positions of the pads 20 on the hand. In this case, the pads 20 are equally spaced from each other at a pitch of 120 degrees.

Compared with the arrangement of the pads 20 of FIG. 4A where the center of gravity G of the wafer W is not at the same distance from the pads 20, the arrangement of FIG. 4B provides a greater safety margin to more reliably prevent the wafer W from falling off the hand 10 while being carried.

Configurations of the hand 10 and the pads 20 of the substrate carrying device and arrangements of the pads 20 according to the embodiment of the present invention are described above. The pads 20 of the present embodiment are attached to the hand 10 without using an adhesive, and therefore can be replaced easily. Also, the pads 20 of the present embodiment do not adhere to a wafer even after vacuum-suctioning the wafer for a long period of time. Further, the pads 20 of the present embodiment can stably vacuum-suction even a warped wafer.

Because the flange 21 and the fixing part 22 of the pad 20 are provided as separate parts, it is possible to replace only the flange 21. This makes it possible to reduce the lead time and costs necessary to repair or replace the pad 20. The flange 21 includes the elastic part 21d that is thin and elastic. When a warped wafer is held by the pad 20, the elastic part 21d of the flange 21 deforms or bends to conform to the warpage of the wafer and thereby prevents a gap from being formed between the wafer and the substrate holding part 21a. This configuration makes it possible to stably vacuum-suction and carry a wafer.

A substrate carrying device, a hand of the substrate carrying device, and a pad attached to the hand to hold a substrate are described above as embodiments of the present invention. However, the present invention is not limited to the specifically disclosed embodiments, and variations and modifications may be made without departing from the scope of the present invention. Also, the embodiments and their variations may be combined in any appropriate manner.

A substrate carrying device according to an embodiment of the present invention may be used to carry a substrate into a semiconductor production apparatus. Examples of semiconductor production apparatuses include an etching apparatus, an ashing apparatus, a film deposition apparatus, a washing apparatus, and an inspection apparatus. A substrate carrying device according to an embodiment of the present invention may also be used to carry a substrate such as a photomask or a wafer during a semiconductor device production process.

A substrate to be carried by a substrate carrying device of an embodiment of the present invention is not limited to a wafer. For example, the substrate carrying device may be used to carry a reticle (photomask), a large-size substrate for a flat panel display, an EL element, or a substrate for a solar battery.

An aspect of this disclosure provides a substrate carrying device including replaceable pads that can absorb (or accommodate) warpage of a substrate and thereby stably vacuum-suction the substrate.

What is claimed is:

1. A substrate carrying device, comprising:
a plurality of pads that hold a substrate, each of the pads including a flange; and
a hand having recesses formed therein, each of the pads being placed in a recess of the recesses and detachably attached to the hand,
wherein the flange of at least one of the pads includes
a circular outer peripheral part that is in contact with and detachably attached to a bottom of the recess,
an elastic part that is disposed closer to a center of the flange than the outer peripheral part, and
a substrate holding part that rises from an inner edge of the elastic part, contacts the substrate, and holds the substrate by vacuum suction, wherein
the recess includes an indented part that is formed in the bottom of the recess to form a space between a bottom of the indented part and the elastic part; and
the elastic part is configured to bend using the space according to a weight of the substrate held on the substrate holding part.

2. The substrate carrying device as claimed in claim 1, wherein each of the pads further includes a fixing part that presses the outer peripheral part of the flange and thereby attaches the outer peripheral part to the hand.

3. The substrate carrying device as claimed in claim 1, wherein the outer peripheral part of the flange is thicker than the elastic part.

4. The substrate carrying device as claimed in claim 1, wherein the flange and the recess have a circular shape.

5. The substrate carrying device as claimed in claim 1, wherein
a number of the pads is three and a number of the recesses is three; and
the pads are attached to the hand such that a center of gravity of the substrate held by the pads is placed in an area defined by lines connecting positions of the pads on the hand.

6. The substrate carrying device as claimed in claim 5, wherein the pads are attached to the hand such that the center of gravity of the substrate held by the pads is placed at or near a position that is at a same distance from the positions of the pads on the hand.

7. A pad placed in a recess formed in a hand of a substrate carrying device and detachably attached to the hand, the pad comprising:
a flange that includes
a circular outer peripheral part that is in contact with and detachably attached to a bottom of the recess,
an elastic part that is disposed closer to a center of the flange than the outer peripheral part, and a substrate holding part that rises from an inner edge of the elastic part, contacts a substrate, and holds the substrate by vacuum suction, wherein the recess includes an indented part that is formed in the bottom of the recess to form a space between a bottom of the indented part and the elastic part; and the elastic part is configured to bend using the space according to a weight of the substrate held on the substrate holding part.

* * * * *